United States Patent [19]

Ruiz

[11] Patent Number: 4,674,778
[45] Date of Patent: Jun. 23, 1987

[54] LOCKING RING FOR ELECTRICAL MEASURING DEVICE

[76] Inventor: Jose M. Ruiz, 1719 Laredo, Laredo, Tex. 78040

[21] Appl. No.: 818,274

[22] Filed: Jan. 13, 1986

[51] Int. Cl.⁴ ............................................. B65D 45/32
[52] U.S. Cl. ............................. 292/256.6; 24/20 EE; 220/319; 292/307 B; 292/320
[58] Field of Search ........... 292/256.6, 256.63, 256.65, 292/303, 307 B, 317-324, 307 R, 104, 106, 107; 70/164; 220/319, 320, 324; 361/369; 24/20 EE, 23 EE, 585

[56] References Cited

U.S. PATENT DOCUMENTS

| | | | |
|---|---|---|---|
| 3,380,267 | 4/1968 | Winchester | 292/307 R X |
| 4,149,741 | 4/1979 | Lipscomb et al. | 292/256.6 |
| 4,226,102 | 10/1980 | Mattress | 292/256.6 X |
| 4,286,640 | 9/1981 | Knox et al. | 292/307 B X |
| 4,331,012 | 5/1982 | Swisher | 292/256.6 X |
| 4,405,161 | 9/1983 | Young et al. | 292/307 B X |
| 4,457,445 | 7/1984 | Hanks et al. | 220/319 X |
| 4,471,982 | 9/1984 | Nielsen | 292/307 B |
| 4,531,770 | 7/1985 | Mattress | 292/307 R |
| 4,544,190 | 10/1985 | Swift et al. | 292/307 B |

FOREIGN PATENT DOCUMENTS

2130147 5/1984 United Kingdom ............ 292/307 B

*Primary Examiner*—Robert L. Wolfe
*Assistant Examiner*—Lloyd A. Gall
*Attorney, Agent, or Firm*—Dodge, Bush & Moseley

[57] ABSTRACT

A locking ring formed of a plurality of curved clamp portions connecting in an end-to-end relationship for securing an electrical power measuring device with a mounting base is disclosed. The semi-circular clamp portions are molded from a single piece of plastic, are identical in construction and are fully interchangeable. Each clamp is preferably formed with a semi-circular curved arc body having a male connection at one end and a female connection at the other end. The male end is formed with a pair of projections of which the first male projection serves as an alignment guide during make-up and use while the second male projection carries a movable latch shoulder for effecting the end-to-end connection with the adjacent mating clamp portion. The female end includes a housing having a central opening with separated first and second entrances formed by a roof mounted lug. The lug also forms a locking surface for engaging with the latch surface of the second male projection of the adjacent clamp portion to operably connect the clamp portions. A tampering indicating locking block is forced into the second entrance after the clamp portions are connected to block movement of the second male projection that would disengage the latch shoulder.

7 Claims, 11 Drawing Figures

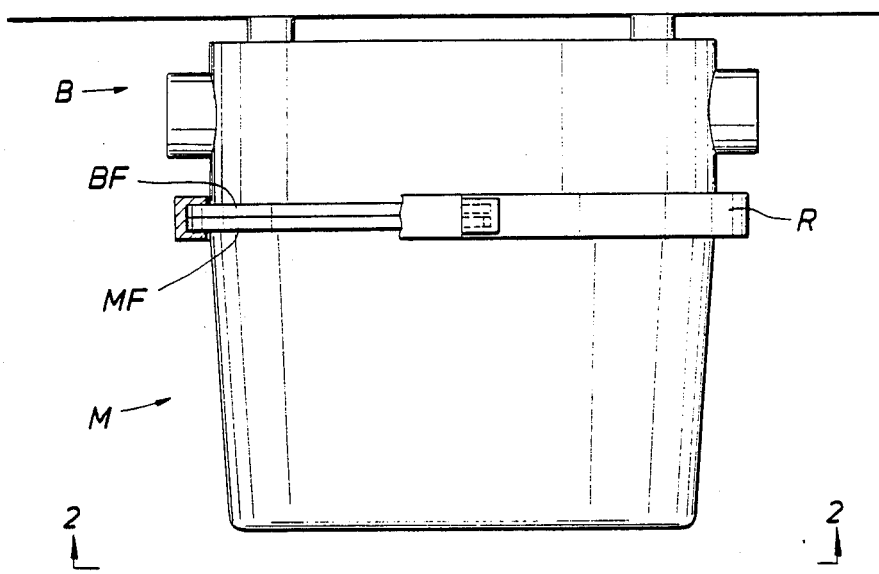
FIG.1
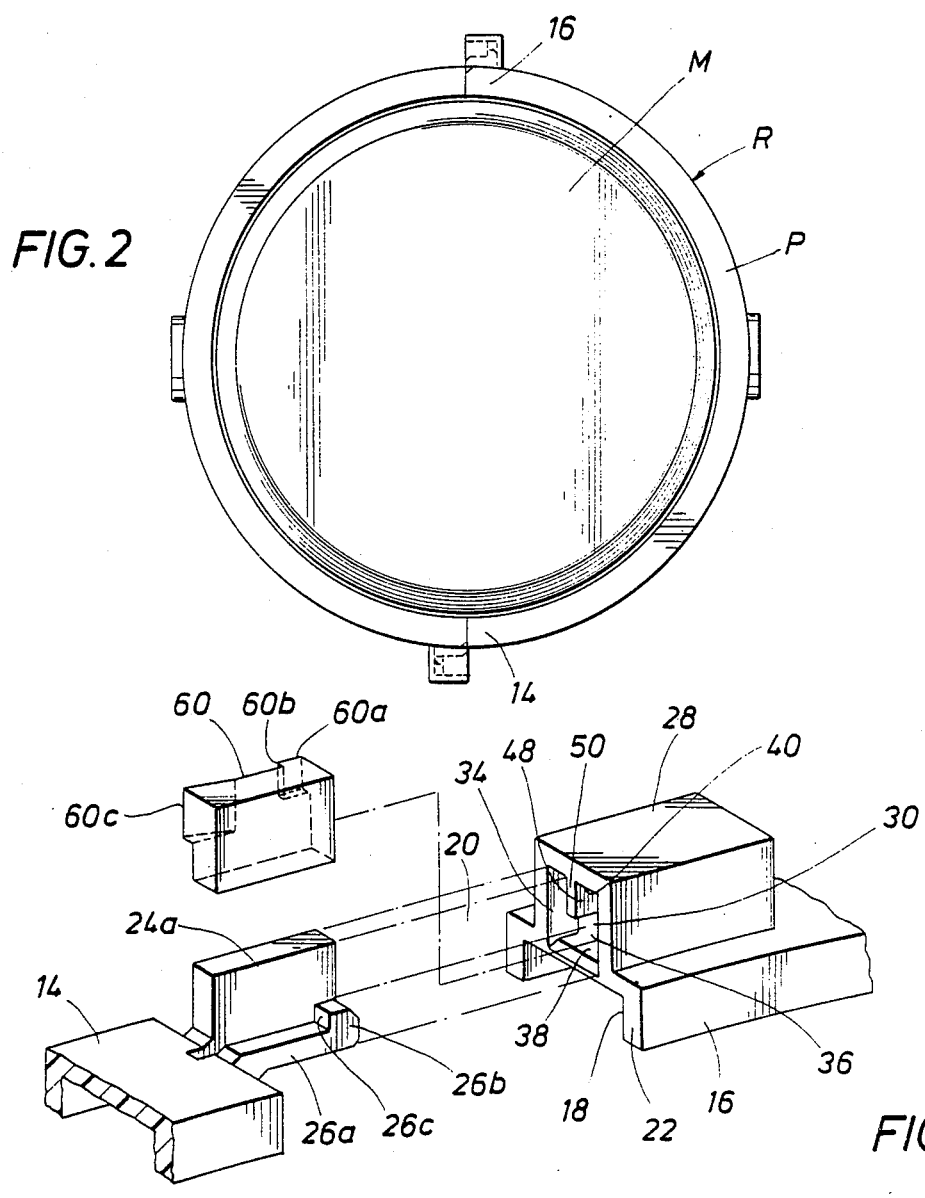
FIG.2
FIG.3

LOCKING RING FOR ELECTRICAL MEASURING DEVICE

BACKGROUND OF THE INVENTION

1. Field of the Invention

The present invention relates generally to the field of locking rings and more particularly to the field of locking rings for electrical energy measuring devices.

2. Background Art

Electrical energy measuring devices, both single and poly-phase, are used to indicate the actual electrical power consumption by a particular customer and are well known. One of the most common of such measuring devices is the electro-mechanical induction-type watt-hour meter which is used to measure actual electrical power consumed by most residential customers. The meter is electrically connected in the electrical power supply wiring to the customer's electrical load wiring network and is located at some convenient, accessible location on the customer's premises for minimum disruption of the customers activity. Periodically the meter is read and the customer is billed or charged for the actual consumption of electrical power.

Because the meter is located on the customer premises for convenient access by a meter reader, it is also accessible by others and thereby subject to possible theft or tampering. Because, for ease and speed of installation, the meter is normally operably mounted by plugging into a mounting base, it is also easy to remove. While theft of a meter by a determined individual probably cannot be economically avoided, some tampering and vandalism may be avoided by a suitable securing locking ring. Such locking ring also serves to operably connect the meter with the mounting base for maintaining proper electrical contact between the electrical bayonet connections of the meter and the mounting base.

In the past such meter locking rings have been formed of a gapped substantially circular metal retainer having a concave securing recess which extended about substantially the entire periphery of the engaged circular flanges of the mounting base and the meter. The metal locking retainer was sufficiently elastically deformable to enable concentric installation and then maintain the adjacent flanges in continuous peripheral sealing contact to exclude dirt and moisture from the mounting base. A soft metal end securing seal clamp is then used to close and seal the gapped ends of the installed retainer ring. Should the end clamp be removed, the impressed soft metal seal is broken and tampering is immediately apparent to the person reading the meter. In the event of an indication of tampering, a false meter reading is immediately suspected and a potential unauthorized power consumption problem identified for proper resolution.

The prior art metal securing clamps are expensive, are subject to corrosion and requires the use of a special tool to emboss or form the tattle-tale tampering seal in the soft metal of the end seal clamp.

SUMMARY OF THE INVENTION

The present invention relates to the field of locking rings for use in securing electrical energy measuring devices with a mounting base. The locking ring is preferably formed by a plurality of two identical semi-circular segments or clamp portions which are concentrically assembled about the engaged circular flanges of the electrical metering device and the mounting base. Preferably, each clamp portion is identical in construction and molded as a single piece of plastic. Each resilient clamp portion has an internal groove which surrounds the engaged flanges to provide the securing clamping force which assists in excluding moisture and other undesired foreign matter from the interior of the mounting base. Each clamp portion is formed with a male end and a female end for interchangeably connecting in an end-to-end relationship with another identical clamp portion having such male and female end connections for forming the circular locking ring. The female end connection forms a housing having first and second entrances to a central opening for receiving a mating pair of coacting extensions formed on the male end. The first male end extension is slidably received in the first entrance of the female housing for aligning and guiding the mounting male and female ends during assembly. The second male end extension is received in the second entrance for engaging co-acting shoulders to thereafter prevent separation of the male and female ends. A plastic locking block is forceably placed in the second entrance to prevent inadvertent disengagement or release of the engaged shoulders. The locking block is provided with a resilient locking projection forming a retainer shoulder that co-acts with the housing securing shoulder to prevent removal of the locking block from the housing. In order to release the connection it is necessary to elastically deform or permanently damage the plastic wedge which gives a visible indication of tampering with the meter mounting.

An object of the present invention is to provide a new and improved locking ring apparatus.

Another object of the present invention is to provide a locking ring apparatus formed of two identical segments.

A further object is to provide a locking ring apparatus formed of identical molded plastic segments.

Yet another object is to provide an end connection for plastic locking ring segments that is inexpensive, relatively strong and indicates tampering.

BRIEF DESCRIPTION OF THE DRAWINGS

FIG. 1 is a top view of an electrical measuring device secured to a mounting base by the locking ring apparatus of the present invention;

FIG. 2 is a view taken along line 2—2 of FIG. 1;

FIG. 3 is an exploded view of the end connection of the clamp portions of the locking ring apparatus of the present invention;

DESCRIPTION OF THE PREFERRED EMBODIMENT

Figure 4:
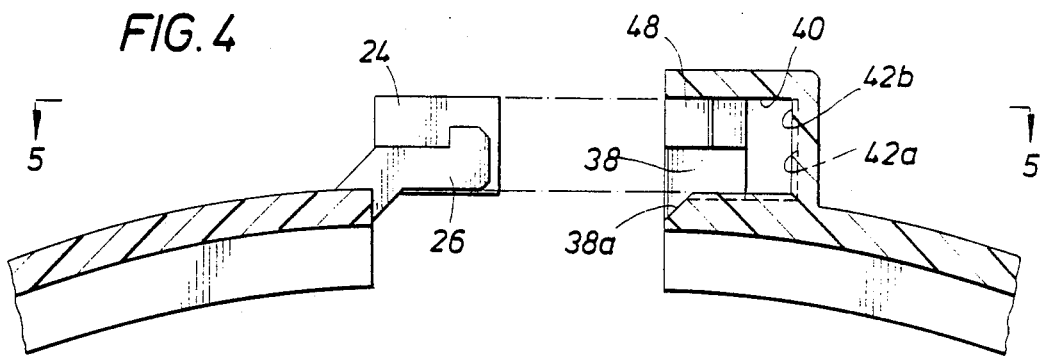
FIG. 4 is a side view, partially in section, of the end connections of the clamp portions prior to assembly.

The locking ring apparatus of the present invention, generally designated R in FIGS. 1 and 2, is preferably adapted to secure an electrical power measuring meter or device M with a conventional meter mounting base B. The mounting base B is secured to a suitable support structure S which is normally located in the customer premises at a suitable convenient location for access by a meter reader for the electrical power company. The meter reader periodically inspects the mounting seal on meter and records the indicated meter reading and the customer is then billed for the actual electrical power consumed. If the seal indicates tampering, the meter reader is alerted and a proper investigation may be undertaken to determine what actually has occurred.

The meter M may be of either the electro-mechanical or electronic type, but normally an electro-mechanical inductive type meter having a horizontal rotating disc is employed. To maintain the rotating disc horizontal during meter operation the mounting base B is secured vertically to the support structure. The support structure also serves to operably mount both the power supply and customer network wiring (not illustrated). This wiring is connected to a plurality of socket terminals (not illustrated) disposed in the interior of the base B for electrically contacting with bayonet plug-in terminals on the meter M as well as for aiding in aligning and mounting the meter M. Circular flanges BF and MF on the base B and meter M, respectively, are brought into engagement (FIG. 1) when the meter M is properly installed on the base B. When the flanges MF and BF are engaged, the clamp or locking ring R is concentrically installed about the engaged flanges MF and BF to clamp the meter M with the base B.

As best illustrated in FIG. 2, the locking ring apparatus R is preferably formed by a pair of identical semicircular curved clamp segments or portions P that are operably installed in concentric surrounding relationship about the periphery of the engaged flanges BF and MF. The resulting locking ring R formed by the plurality of two adjacent interchangeable clamp portions P connected in an end-to-end relationship which serves to secure the meter M with the base B while sealing between the flanges BF and MF to prevent entry of dirt and moistire into the interior of the base B. The central body 12 extends through a predetermined arc of the flanges BF and MF, normally 180 degrees each, but other arcs, such as 120 degrees requiring a plurality of three clamp portions P, may be predetermined. The base B may be of any suitable type such as that disclosed in my co-pending application, Ser. No. 809,561, filed Dec. 16, 1985, entitled "Mounting Base Apparatus" which is hereby totally incorporated herein for all purpose by this specific reference.

Each clamp portion P has a curved central body or member 12 and a first or male end 14 and a second or female end 16 (FIG. 2). The central body 12 forms a concave recess 18 which fits snugly about the outer periphery of the abutting circular flanges BF and MF for clamping the meter M to the base B. Each of the plurality of identical clamp portions P are preferably molded of one piece of a resilient plastic material, preferably polypropylene having a 10% fiberglass filler, to provide sufficient strength and rigidity to ensure proper and adequate clamping force to the flanges MF and BF. A pair of side walls 20 and 22 defining the recess 18 provide the resilient clamping action as well as additional strength and rigidity to the semi-circular body 12. During installation about the flanges MF and BF the central body 12 is sufficiently resiliently deformed to provide a circular side clamping force with side walls 20 and 22 to hold and seal the flanges MF and BF.

The male end 14 of each clamp portion P has a first extension 24 and a second extension 26. The two male extensions 24 and 26 are adapted to be operably received in the female end connection 16 of an identically constructed, adjacent clamp portion P to interconnect the two clamp portions P to form the locking ring R. The identical male end 14 and female end 16 construction of each clamp portion P enables full interchangeability of the clamp portions P in forming the locking ring R.

The first male extension 24 is provided with a large rectangular block 24a which aligns the ends 14 and 16 of the mating clamp portions P during assembly of the end connections 14 and 16 of the locking ring R in a manner to be more fully described. The rectangular block 24, due to its size dimensions, also prevents or precludes improper make-up of the end connections 24 and 26 with the female end 16. When made up into locking ring R, the extension 24a also serves as a strength member to resist side forces acting to separate the end connection from the end-to-end relationship.

Figure 5:
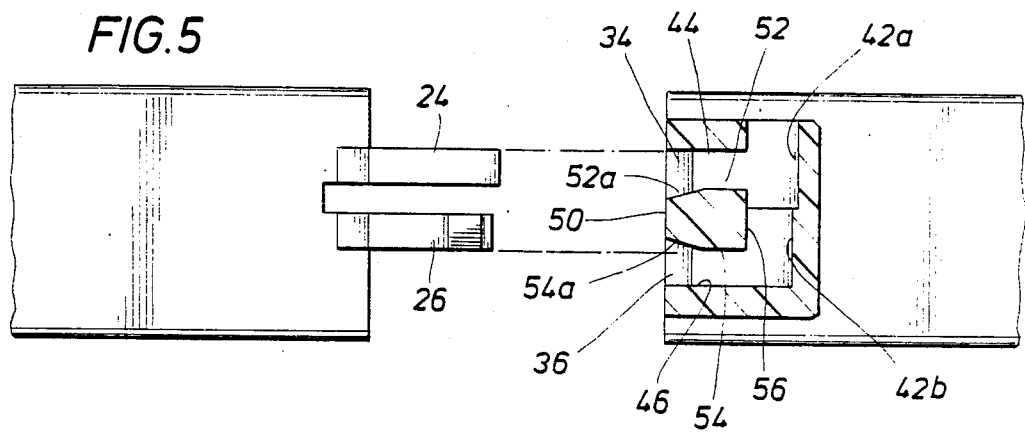
FIG. 5 is a view taken along line 5—5 of FIG. 4.
Figure 6:
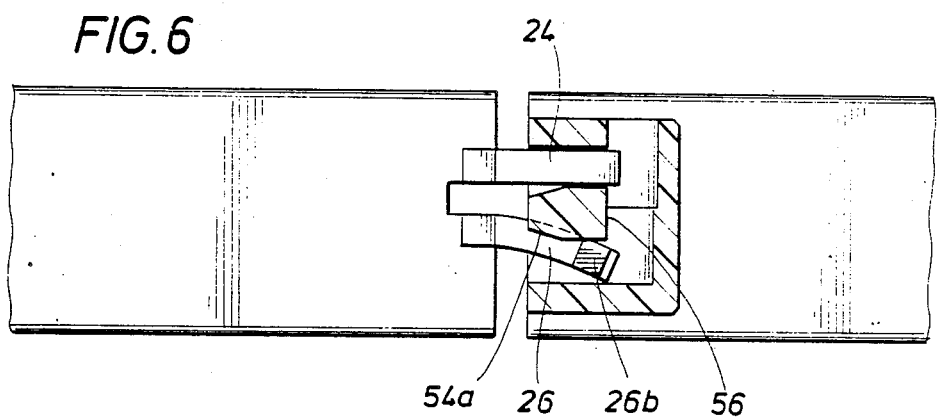
FIGS. 6 and 7 are views similar to FIG. 5 illustrating the sequence of assembly of the end connection.
Figure 7:
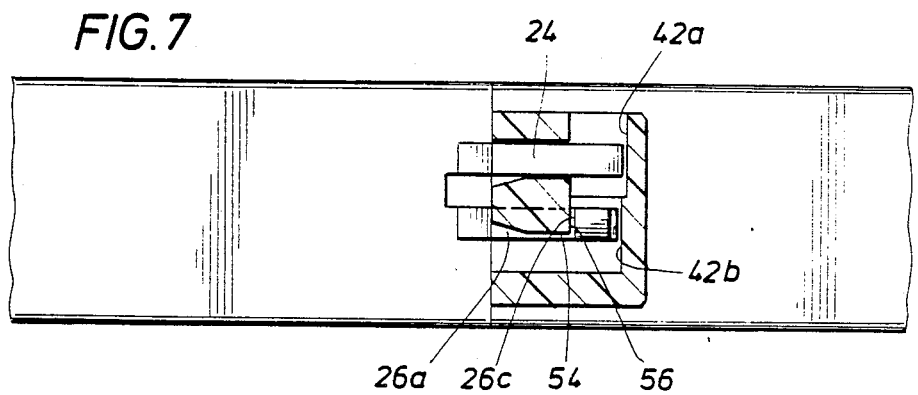

The second male extension 26 includes a cantilever resilient arm 26a terminininating in an enlarged head 26b forming a rearwardly facing locking or latch surface 6c (FIG. 3). The arm 26a enables sufficient flexing (FIG. 6) for the head 26b to move out of its normal parallel position (FIG. 5) relative to the block or guide extension 24a while providing sufficient resilience to enable return to the normal parallel position (FIG. 7) when fully inserted.

The female end 16 includes a hollow rectangular housing 28 (FIG. 3) having a central internal chamber or cavity 30. The molded female housing 28 forms a first entrance or opening 34 and a second entrance or opening 36 for operably receiving the first and second male extensions 24 and 26, respectively (FIG. 3) into the chamber 30.

Figure 10:
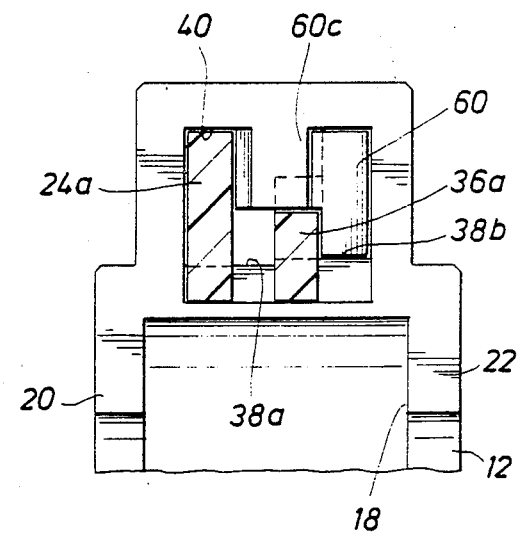
FIG. 10 is a view taken along line 10—10 of FIG. 9.

The enclosed chamber 30 is partially defined by a floor 38 and a roof or ceiling 40 that are disposed in substantially parallel horizontal relationship. The substantially rectangular floor 38 is provided with a tapered or beveled edge 38a adjacent the entrances 34 and 36 for ease of assembly of the male extensions 24 and 26 into entrances 34 and 36. A stepped end wall 42 and a pair of parallel side walls 44 and 46 (FIG. 5) further define the extent of the chamber 30. As best illustrated in FIG. 10, the substantially flat floor 38 is also stepped with the substantially planar floor portion 38 adjacent first entrance 34 disposed slightly below substantially planar floor portion 38b. The distance between the ceiling 40 and floor portion 38 is dimensioned to receive the first male guide extension 24a, but the distance between floor portion 38b and ceiling 40 is less than the height of the guide 24a. This dimensional arrangement prevents inadvertent assembly with first male extension 24 in the second entrance 36. Also, the substantially planar rear end wall 42 is also stepped to form vertical surfaces 42a and 42b with the surface 42a dimensioned to enable the receiving of the first male extension 24, but the surface 42b prevents full insertion of the first male extension 24 into the chamber 30 through the second entrance 36.

Figure 8:
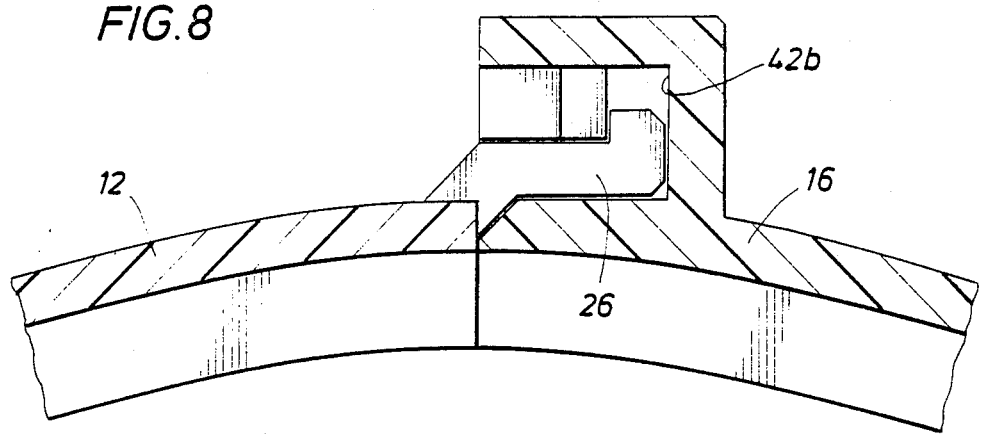
FIG. 8 is a view similar to FIG. 4 illustrating the assembled end connection.

Dividing the chamber 30 into the first and second entrances 34 and 36 is a roof projection body or lug 48 that extends downwardly from the ceiling 40 into the chamber 30. The body 48 forms an end wall 50 separating entrances 34 and 36 and a pair of substantially rectangular parallel side walls 52 and 54. A substantially planar back wall 56 formed of the body 48 and facing rear wall 42 serves as a locking shoulder or surface for engaging the latching surface 26c of the second male extension 26. As best illustrated in FIG. 8, the body 48 extends downwardly a sufficient distance to provide sufficient clearance to enable the flexible arm 26a to be positioned between the body 48 and the floor 38, but not the enlarged head 26b.

During insertion (FIG. 6) the guide male extension 24 is closely held against lateral movement by side walls 44 and 52. This insures proper alignment during end-to-end make-up and resists lateral separating forces urging on the assembled locking ring R. During insertion, the enlarged head 26b of the second male extension 26 rides along wall 54 by flexing arm 26a until latch shoulder 26c passes locking surface 56. At that time, the resilient arm 26a moves under the body 48 to bring latch shoulder 26c surface 26c and locking shoulder surface 56 into operable locking engagement for connecting the clamp portions P against separation in the end-to-end relationship. When this occurs, the male extensions 24 and 26 are fully inserted in the female housing 28 and the locking condition illustrated in FIG. 7 exists. The end connection on the other ends of the two clamp portions P are joined about the flanges BF and MF in the identical manner.

Figure 9:
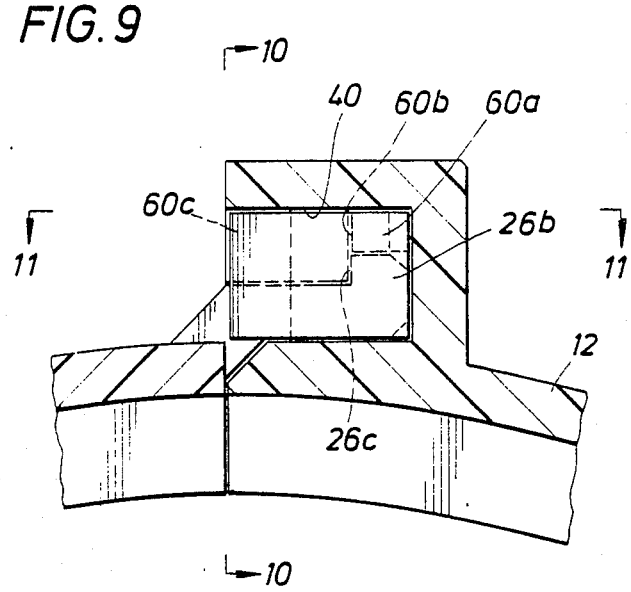
FIG. 9 is a view similar to FIG. 8 illustrating the installed position of the locking wedge.
Figure 11:
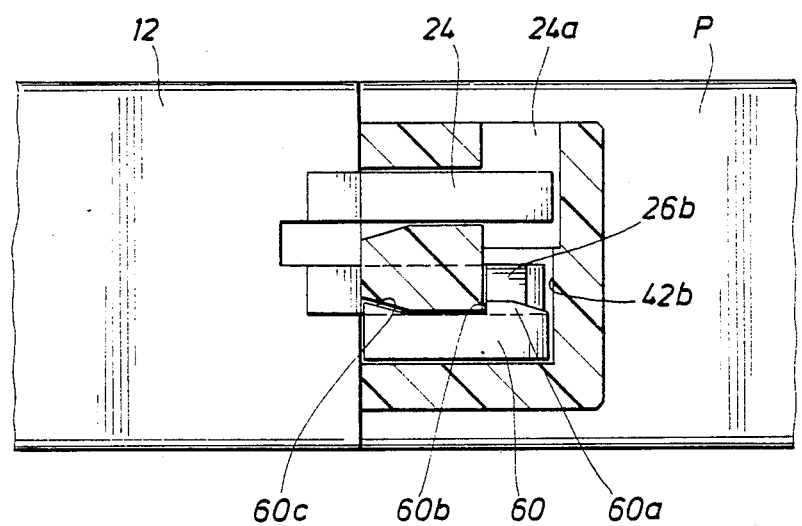
FIG. 11 is a view taken along line 11—11 of FIG. 9.

To prevent inadvertent or undesired disengagement of the clamp portions P by releasing the connecting locking shoulders 26c and 56, a tamper proof locking member or block (FIG. 3) 60 is employed with each made up end connection. The locking block 60 is inserted into the second entrance 36 and forced into place after the locking shoulders 26c and 56 are brought into engagement. The molded plastic locking block 60 (FIG. 3) is in the form of a substantially rectangular member having a resilient locking projection 60a forming a locking surface 60b. When forceably inserted into the second entrance 36 above arm 26a (FIGS. 9, 10 and 11), the projection 60a extends past locking shoulder 56 which is then engaged by locking surface 60c to prevent undesired removal of the locking block 60. A pair of pliers or other suitable hand tool may conveniently be used to force the wedge 60 into the housing 28 a sufficient distance to bring shoulders 60b and 56 into locking engagement. The block 60 is dimensioned to contact both floor 38 and roof 40 to eliminate any vertical movement of block 60. To further prevent tampering, the wedge 60 is dimensioned to snugly fit between walls 46 and 54 and tapered edge projection 60c is provided to fit snugly adjacent to the tapered wall portion 54a to prevent insertion of a knife blade or the like between walls 54 and the wedge block 60 (FIG. 11). The presence of the block 60 between walls 46 and 54 prevents sideways flexing of an arm 26a to release latch shoulder 26c. From FIG. 9 it will be appreciated that projection 60a fits tightly between ceiling 40 and the enlarged head 60b to also prevent flexing of arm 26a. Likewise the tapered projection 60c extends downwardly until tightly adjacent arm 26a (FIG. 10) to prevent inserting of a knife blade along those surfaces. Insertion of a blade or other instrument will result in permanent damage to the housing 28 or locking block 60 and will thereby give a positive indicative of tampering.

USE AND OPERATION OF THE PRESENT INVENTION

In the use and operation of the present invention, the meter M is inserted into the base B until flanges BF and MF are brought into engagement. Two of the identical clamp portions P are then placed in surrounding relationship about the flanges BF and MF with the recess 18 adjacent the flanges. The male end projection 26 and 28 of one clamp portion P are then inserted into the first and second entrances 34 and 36, respectively, of the female housing 28 of the other clamp portion P. While insuring alignment of the recess 18 with the flanges BF and MF, the other ends of the clamp portion are assembled in the same manner. The end connections are then in the condition illustrated in FIGS. 7 and 8. Using pliers, locking wedges 60 are then forced into the second entrance 36 of the female housing 28 of each of the two clamp portions P. This forms the locking ring R and operably secures the meter M with the base B.

The foregoing disclosure and description of the invention are illustrative and explanatory thereof, and various changes in the size, shape, and materials, as wells as in the details of the illustrated construction, may be made without departing from the spirit of the invention.

What is claimed is:

1. A clamp portion adopted for forming a portion of a locking ring for operably securing an electrical power measuring meter with a suitable mounting base, including:

a curved central body having a male end and a female end for connecting in an end-to-end relationship with an adjacent clamp portion to form the locking ring, said central body having parallel side walls forming a concave recess for fitting about the abutting flanges of the meter and mounting base;

said male end having a first projection and a second projection for connecting with the female end of the adjacent clamp portion;

said female end forming a housing having a central opening, a first entrance to said central opening and a second entrance to said central opening, said first entrance for receiving the first male projection of the adjacent clamp portion for maintaining said clamp portion and the adjacent clamp portion aligned in an end-to-end alignment relationship, said second entrance for receiving the second male projection of the adjacent clamp portion for connecting the adjacent clamp portion with said clamp portion;

said central opening of said housing having a roof forming a downwardly projecting lug for separating said first entrance and said second entrance, said lug forming a locking surface facing toward said central body; and said locking surface adapted to engage a securing surface on the second male extension of the adjacent clamp portion for connecting the adjacent clamp portion in end-to-end relationship with said clamp portion.

2. A clamp portion adopted for forming a portion of a locking ring for operably securing an electrical power measuring meter with a suitable mounting base, including:

a curved central body having a male end and a female end for connecting in an end-to-end relationship with an adjacent clamp portion to form the locking ring, said central body having parallel side walls forming a concave recess for fitting about the abutting flanges of the meter and mounting base;

said male end having a first projection and a second projection for connecting with the female end of the adjacent clamp portion;

said female end forming a housing having a central opening, a first entrance to said central opening and a second entrance to said central opening, said first entrance for receiving the first male projection of the adjacent clamp portion for maintaining said clamp portion and the adjacent clamp portion aligned in an end-to-end alignment relationship, said second entrance for receiving the second male projection of the adjacent clamp portion for connecting the adjacent clamp portion with said clamp portion;

said central opening of said housing having a roof forming a downwardly projecting lug for separating said first entrance and said second entrance, said lug forming a locking surface facing toward said central body; and said central opening of said housing having a floor spaced from said lug, the second projection of the male end of the adjacent clamp portion having a resilient arm mounting an enlarged head forming a latch surface facing the body of the adjacent clamp portion, the resilient arm dimensioned to fit between said floor and said lug, the enlarged head engaging said lug for resiliently deforming the resilient arm until said locking shoulder on said lug is aligned with the latch surface on the enlarged head for enabling the resilient arm to move the latch surface into engagement with said locking surface for connecting the adjacent clamp portion. in end-to-end relationship with said clamp portion 3. The clamp portion as set forth in claim 2, wherein:

said second entrance receiving a locking block forceably inserted therethrough into said central opening, the locking block having a projection forming a securing surface for engaging said locking surface to permit removal of the locking block from said central opening, the locking block preventing movement of the resilient arm which would disengage the latch shoulder from said locking surface.

4. A clamp portion adopted for forming a portion of a locking ring for operably securing an electrical power measuring meter with a suitable mounting base, including:

a curved central body having a male end and a female for connecting in an end-to-end relationship with an adjacent clamp portion to form the locking ring, said central body having parallel side walls forming a concave recess for fitting about the abutting flanges of the meter and mounting base;

said male end having a first projection and a second projection for connecting with the female end of the adjacent clamp portion;

said female end forming a housing having a central opening, a first entrance to said central opening and a second entrance to said central opening, said first entrance for receiving the first male projection of the adjacent clamp portion for maintaining said clamp portion and the adjacent clamp portion aligned in an end-to-end alignment relationship, said second entrance for receiving the second male projection of the adjacent clamp portion for connecting the adjacent clamp portion with said clamp portion;

said first male projection is dimensioned to be received in the first entrance of the adjacent clamp portion and blocked from entry into the second entrance of the adjacent clamp portion, said first male projection maintaining end-to-end alignment relationship of the adjacent clamp portion with said clamp portion;

said second male projection having a resilient arm extending from said clamp portion, said arm forming an enlarged head having a latch surface spaced from and facing said clamp body; and said second male projection arranged to be received in the second entrance of the female housing of the adjacent clamp portion for engaging a locking shoulder provided by the female housing to connect said clamp portion with the adjacent clamp portion to form the locking ring and said second male projection engageable by a locking block inserted into the central opening of the housing through the second entrance to prevent movement of said resilient arm to disengage said latch surface from the locking shoulder.

5. A locking ring apparatus adapted for securing a first unit with a mating second unit when the units are disposed in a juxtoposed relationship, including;

a first molded plastic clamp portion having a recess shaped for concentrically fitting about a peripheral portion of the first unit and the mated second unit;

a second molded plastic clamp portion having a recess shaped for fitting about substantially the remaining peripheral portion of the first unit and the second unit;

said first clamp portion formed by an elongated body having a male end and a female end, said male end having a first extension and a second extension for connecting with said second clamp portion, said female end forming a housing for connecting with said second clamp portion;

said first extension of said first male end formed to align said first clamp portion with said second clamp portion, said second extension of said first male end forming a resilient latch having an enlarged end providing a latch surface, said latch surface adapted to engage when aligned with said clamp portion by said first extension for connecting said clamp portions in an end-to-end relationship;

said housing formed on said female end of said first clamp portion having a central opening with a first entrance and a second entrance providing access to said opening, said first entrance adapted for receiving a first male extension formed on said second clamp portion to align said first clamp portion with said second clamp portion, said second entrance adapted to receive a second male extension formed on said second clamp portion having an enlarged end forming a latch surface for engaging a mating locking surface disposed in said housing for connecting said first and second clamp portions; and a locking member insertable into said second entrance of said housing of said first clamp portion after inserting the second male extension of said second clamp portion into said second entrance for engaging said latch surface, said locking member having a projection forming a securing surface for engaging said locking surface of said female housing to secure said locking member in said central opening to block said resilient arm from flexing sufficiently to release said latch surface from said locking surface.

6. The locking ring apparatus as set forth in claim 5, wherein: said locking member is molded of plastic.

7. The locking ring apparatus as set forth in claim 5, wherein said locking member having a tapered edge for blocking the insertion of a foreign object adjacent said locking member to bend said resilient arm and release said latch surface.

* * * * *